US012791950B2

(12) United States Patent
Van Dongen et al.

(10) Patent No.: US 12,791,950 B2

(45) Date of Patent: Nov. 10, 2026

(54) METHOD FOR DETERMINING A MEASUREMENT RECIPE AND ASSOCIATED APPARATUSES

(71) Applicant: ASML NETHERLANDS B.V., Veldhoven (NL)

(72) Inventors: Jeroen Van Dongen, Houten (NL); Anagnostis Tsiatmas, San Jose, CA (US); Alok Verma, Eindhoven (NL); Vidar Van Der Meijden, Eindhoven (NL); Elliott Gerard Mc Namara, Eindhoven (NL)

(73) Assignee: ASML NETHERLANDS, Veldhoven (NL)

( * ) Notice: Subject to any disclaimer, the term of this patent is extended or adjusted under 35 U.S.C. 154(b) by 431 days.

(21) Appl. No.: 18/681,890

(22) PCT Filed: Jul. 28, 2022

(86) PCT No.: PCT/EP2022/071212
§ 371 (c)(1),
(2) Date: Feb. 7, 2024

(87) PCT Pub. No.: WO2023/025506
PCT Pub. Date: Mar. 2, 2023

(65) Prior Publication Data

US 2025/0224685 A1 Jul. 10, 2025

(30) Foreign Application Priority Data

Aug. 26, 2021 (EP) .................................... 21193233
Dec. 13, 2021 (EP) .................................... 21214132

(51) Int. Cl.
*G06F 7/00* (2006.01)
*G03F 7/00* (2006.01)
*G06F 16/00* (2019.01)

(52) U.S. Cl.
CPC .... *G03F 7/706831* (2023.05); *G03F 7/70625* (2013.01); *G03F 7/70633* (2013.01); *G03F 7/706833* (2023.05); *G03F 7/706841* (2023.05)

(58) Field of Classification Search
None
See application file for complete search history.

(56) References Cited

U.S. PATENT DOCUMENTS 6,952,253 B2 10/2005 Lof et al.
8,823,922 B2 9/2014 Den Boef
(Continued)

FOREIGN PATENT DOCUMENTS

EP 3839632 6/2021
EP 1628164 2/2026
(Continued)

OTHER PUBLICATIONS

International Search Report and Written Opinion issued in corresponding PCT Patent Application No. PCT/EP2022/071212, dated Nov. 7, 2022.

(Continued)

*Primary Examiner* — Tuan A Pham
(74) *Attorney, Agent, or Firm* — Pillsbury Winthrop Shaw Pittman, LLP

(57) ABSTRACT

A method for determining a measurement recipe for measuring a parameter of interest from a compound structure on a substrate. The method includes obtaining first training data relating to measurements of reference targets, the targets including: parameter of interest targets, each parameter of interest target having an induced set value which is varied over the parameter of interest targets; and one or more isolated feature targets, each including repetitions of one or more features. Second training data is obtained, the second (Continued)

training data including compound structure measurement signals obtained from measurement of one or more instances of the compound structure. One or more machine learning models are trained using the first training data and second training data to infer a value for the parameter of interest from a measurement signal related to the compound structure corrected for a feature asymmetry contribution.

19 Claims, 4 Drawing Sheets

(56) References Cited

U.S. PATENT DOCUMENTS

| | | | |
|---|---|---|---|
| 10,453,758 | B2 | 10/2019 | Van Leest et al. |
| 11,022,897 | B2 | 6/2021 | Venselaar et al. |
| 2007/0296960 | A1 | 12/2007 | Den Boef et al. |
| 2008/0198380 | A1 | 8/2008 | Straaijer et al. |
| 2009/0168062 | A1 | 7/2009 | Straaijer |
| 2010/0007863 | A1 | 1/2010 | Jordanoska |
| 2010/0328655 | A1 | 12/2010 | Den Boef |
| 2011/0026032 | A1 | 2/2011 | Den Boef et al. |
| 2011/0032500 | A1 | 2/2011 | Straaijer |
| 2011/0102753 | A1 | 5/2011 | Van De Kerkhof et al. |
| 2011/0102793 | A1 | 5/2011 | Straaijer |
| 2011/0188020 | A1 | 8/2011 | Den Boef |
| 2011/0249244 | A1 | 10/2011 | Leewis et al. |
| 2012/0044470 | A1 | 2/2012 | Smilde et al. |
| 2012/0044495 | A1 | 2/2012 | Straaijer |
| 2013/0162996 | A1 | 6/2013 | Straaijer et al. |
| 2013/0308142 | A1 | 11/2013 | Straijer |
| 2016/0117847 | A1 | 4/2016 | Pandev et al. |
| 2016/0282105 | A1 | 9/2016 | Pandev |
| 2019/0235391 | A1 | 8/2019 | Bijnen et al. |
| 2019/0278190 | A1 | 9/2019 | Middlebrooks et al. |
| 2019/0378012 | A1 * | 12/2019 | Tripodi ................ G06N 3/0455 |
| 2021/0191280 | A1 | 6/2021 | Medvedyeva et al. |
| 2022/0082944 | A1 | 3/2022 | Rehman et al. |
| 2024/0111221 | A1 * | 4/2024 | Van Laarhoven .. G03F 7/70616 |

FOREIGN PATENT DOCUMENTS

| | | |
|---|---|---|
| TW | 201743142 | 12/2017 |
| TW | 201937297 | 9/2019 |
| TW | 201946179 | 12/2019 |
| TW | 201946180 | 12/2019 |
| TW | 202032286 | 9/2020 |
| TW | 202105822 | 2/2021 |

OTHER PUBLICATIONS

Office Action issued in Israeli Patent Application No. 310738, dated May 31, 2026.

* cited by examiner

METHOD FOR DETERMINING A MEASUREMENT RECIPE AND ASSOCIATED APPARATUSES

CROSS REFERENCE TO RELATED APPLICATIONS

This application is the U.S. national phase entry of PCT Patent Application No. PCT/EP2022/071212 which was filed on Jul. 28, 2022, which claims priority of European Patent Application No. 21193233.0 which was filed on Aug. 26, 2021 and European Patent Application No. 21214132.9 which was filed on Dec. 13, 2021, which are incorporated herein in their entireties by reference.

FIELD

The present invention relates to metrology applications in the manufacture of integrated circuits.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1\times\lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

Metrology tools are used in many aspects of the IC manufacturing process, for example as alignment tools for proper positioning of a substrate prior to an exposure and scatterometry based tools for inspecting/measuring the exposed and/or etched product in process control; e.g., to measure overlay.

To perform metrology, a measurement recipe comprising a number of metrology settings, such as illumination settings, should be selected as these typically affect the measurement quality. It would be desirable to improve on determination methods of determining a measurement recipe.

SUMMARY

In a first aspect of the invention there is provided a method for determining a measurement recipe describing measurement settings for measuring a parameter of interest from a compound structure on a substrate; the method comprising: obtaining first training data relating to measurements of a plurality of reference targets, the plurality of reference targets comprising: a plurality of parameter of interest targets, each parameter of interest target having an induced set value which is varied over said plurality of parameter of interest targets; and one or more isolated feature targets, each comprising repetitions of one or more features comprised within said compound structure in isolation from other features of said compound structure; obtaining second training data comprising a plurality of compound structure measurement signals obtained from measurement of one or more instances of said compound structure, each of said compound structure measurement signals comprising a feature asymmetry contribution due to asymmetry of said one or more features; and training one or more machine learning models using said first training data and second training data to infer a value for the parameter of interest from a measurement signal related to said compound structure corrected for said feature asymmetry contribution.

In a second aspect of the invention there is provided a substrate comprising: at least one compound structure; and at least one target cluster, each said target cluster comprising a plurality of reference targets, the plurality of reference targets comprising: a plurality of parameter of interest targets, each parameter of interest target having an induced set value which is varied over said plurality of parameter of interest targets; and one or more isolated feature targets, each comprising repetitions of one or more features comprised within a compound structure in isolation from other features of said structure.

The invention yet further provides a computer program product comprising machine-readable instructions for causing a processor to perform the method of the first aspect, and associated metrology apparatus.

The above and other aspects of the invention will be understood from a consideration of the examples described below.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
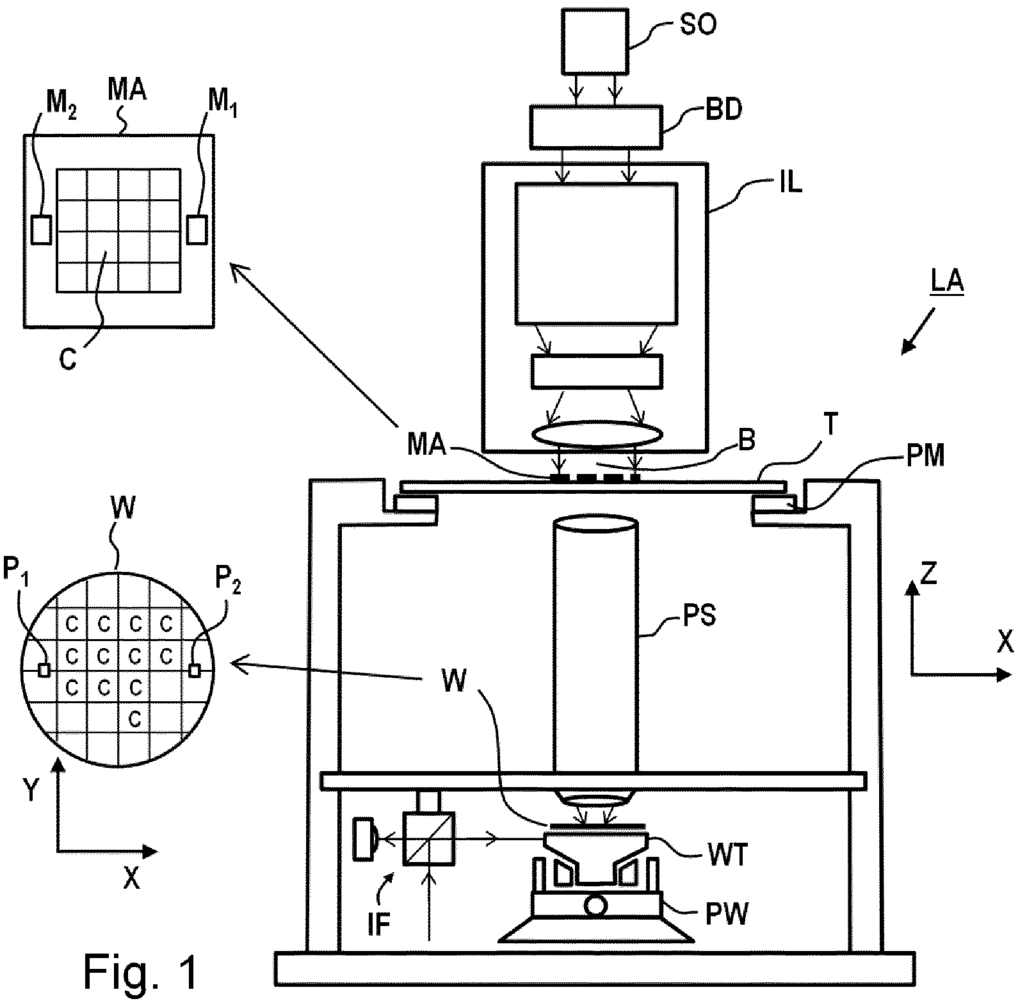
FIG. 1 depicts a schematic overview of a lithographic apparatus.

FIG. 1 schematically depicts a lithographic apparatus LA or scanner (the two terms are used synonymously, although the concepts herein may also be applicable to stepper arrangements). The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
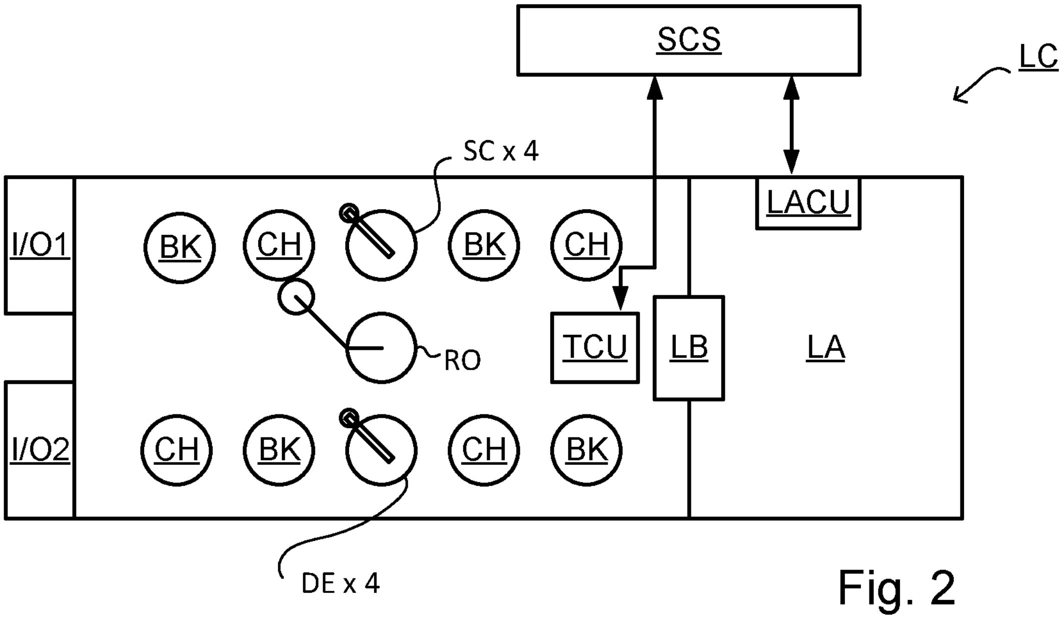
FIG. 2 depicts a schematic overview of a lithographic cell.

As shown in FIG. 2 the lithographic apparatus LA may form part of a lithographic cell LC, also sometimes referred to as a lithocell or (litho) cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
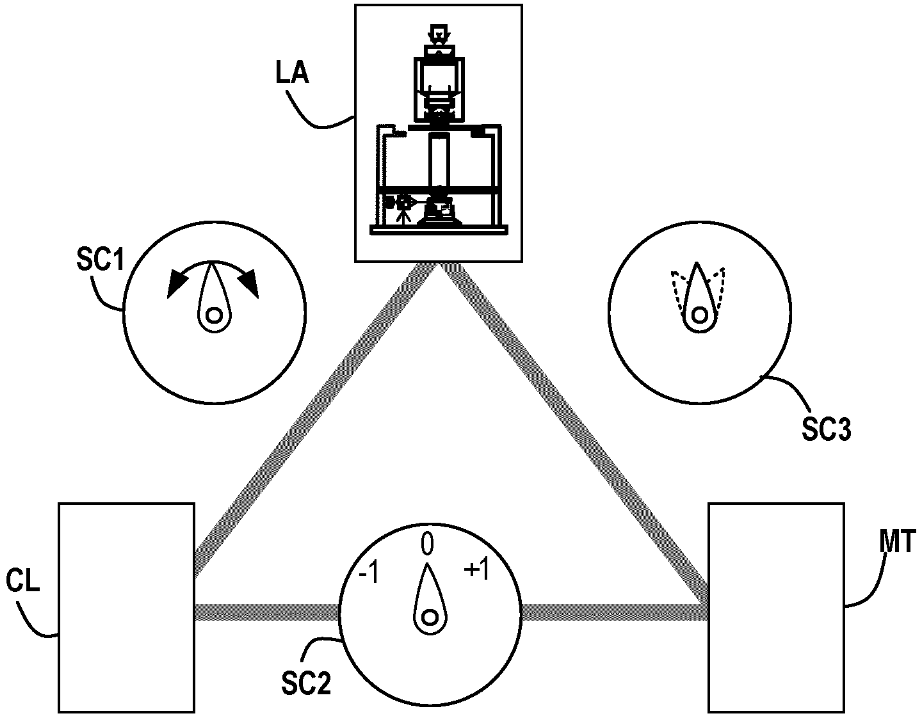
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called “holistic” control environment as schematically depicted in FIG. 3. One of these systems is the lithographic apparatus LA which is (virtually) connected to a metrology tool MT (a second system) and to a computer system CL (a third system). The key of such “holistic” environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing “0” in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray and visible to near-IR wavelength range.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target arrangement and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is a ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent applications Ser. Nos. 11/451,599, 11/708,678, 12/256,780, 12/486,449, 12/920,968, 12/922,587, 13/000,229, 13/033,135, 13/533,110 and Ser. No. 13/891,410 incorporated herein by reference in their entirety.

Figure 4:
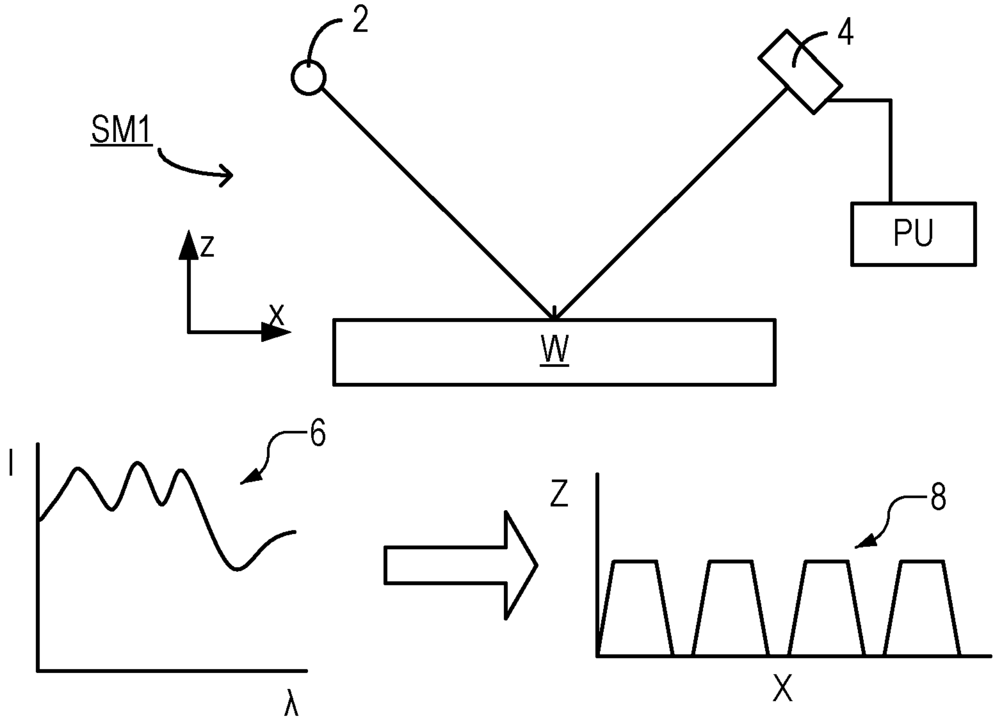
FIG. 4 depicts a schematic overview of a scatterometry apparatus used as a metrology device, for use in methods according to embodiments of the invention.

A metrology apparatus, such as a scatterometer, is depicted in FIG. 4. It comprises a broadband (white light) radiation projector 2 which projects radiation onto a substrate W. The reflected or scattered radiation is passed to a spectrometer detector 4, which measures a spectrum 6 (i.e. a measurement of intensity as a function of wavelength) of the specular reflected radiation. From this data, the structure or profile 8 giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 5:
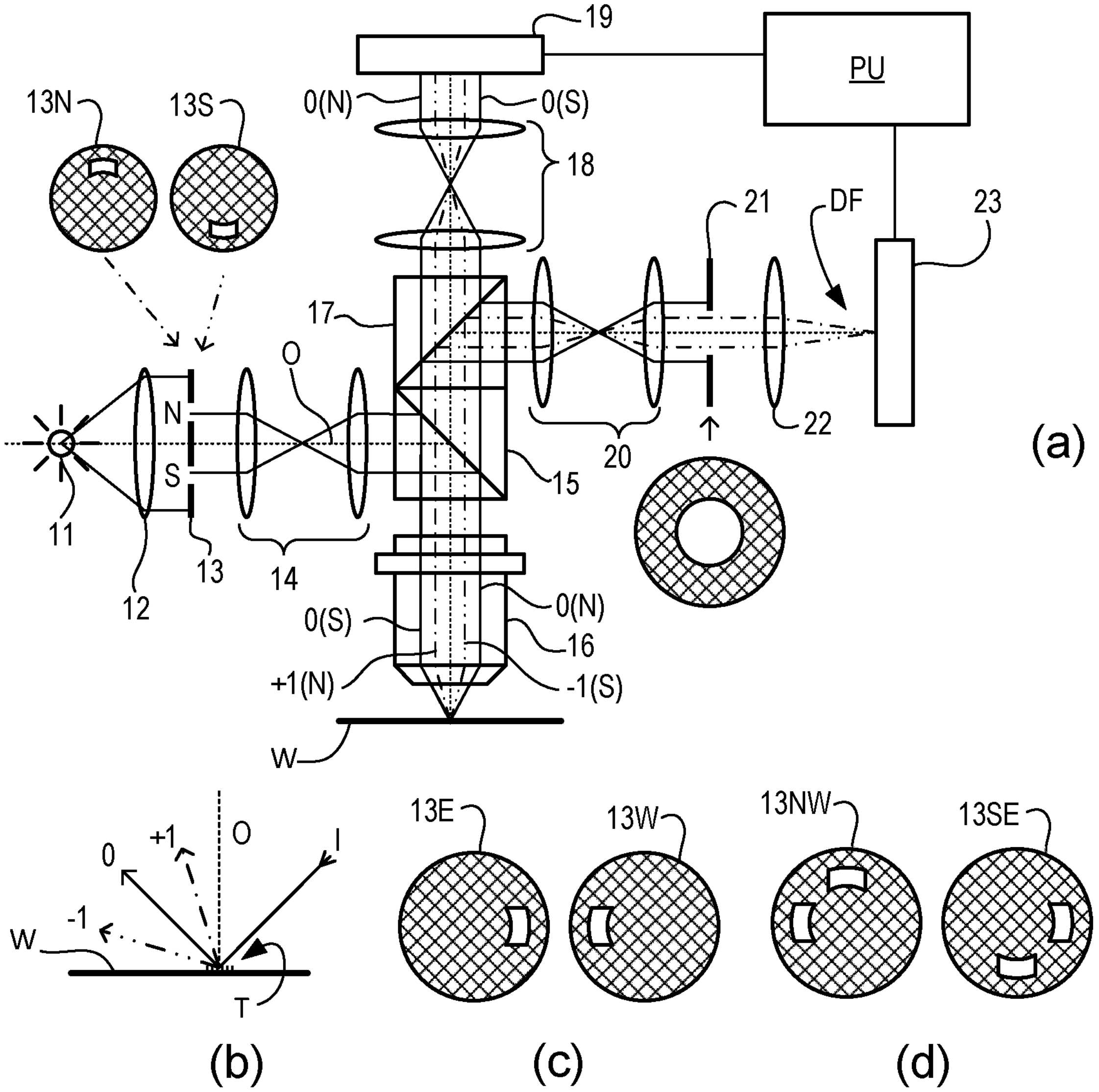
FIG. 5 comprises (a) a schematic diagram of a pupil and dark field scatterometer for use in methods according to embodiments of the invention using a first pair of illumination apertures, and (b) a detail of diffraction spectrum of a target grating for a given direction of illumination.

FIG. 5(*a*) presents an embodiment of a metrology apparatus and, more specifically, a dark field scatterometer. A target T and diffracted rays of measurement radiation used to illuminate the target are illustrated in more detail in FIG. 5(*b*). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the illumination angles can be designed or adjusted so that the first order rays entering the objective lens are closely aligned with the central optical axis. The rays illustrated in FIGS. 5(*a*) and 3(*b*) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 5(*a*), both the first and second illumination modes are illustrated, by designating diametrically opposite apertures labeled as north (N) and south(S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled 1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction. The concepts disclosed herein relate to pupil measurements using this branch.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term ‘image’ is used here in a broad sense. An image of the grating lines as such will not be formed, if only one of the −1 and +1 orders is present. The particular forms of aperture plate 13 and field stop 21 shown in FIG. 5 are purely examples.

The metrology tools described above may be used to measure overlay in-device using the zeroth order response (pupil) after-etch. This method is currently known as In-Device-Metrology OV (IDM OV). The main functional requirement of IDM is that the target under measurement comprises asymmetry when an overlay error exists. By monitoring the induced asymmetry in the zeroth order pupil, IDM can measure the existing overlay. IDM may be measured directly on product structure if sufficiently regular, and in this context a “target” may comprise actual functional product structure used for metrology rather than a purposely formed metrology target. Alternatively, purposely formed targets, which may include in-die targets, may be formed and measured which mimic the behavior of the surrounding product structure (e.g., it may comprise a regularized approximation of the product structure). For example, when the product structure is not regular (e.g., logic structures), the in-die targets should act as a proxy for the in-die device patterns. As such, the in-die targets should be representative of the logic structures within the die (i.e., the logic circuits for which they act as proxy). The design of such logic circuits may be based on a device structure simplification method, where elements of the logic structure are extracted from a unit cell which may be repeated to form a periodic target.

To measure the overlay, a recipe needs to be created, which should only be sensitive to the overlay of interest, and robust to process variations and other asymmetries. Due to the cross-polarization, many acquisition settings (wavelength, grating-to-sensor rotations and polarizations) may result in a recipe that shows sensitivity for the OV of interest. Unfortunately, many of these recipes may measure a different wafer map for the same wafer, with large point-to-point differences. This phenomenon is in particular observed for the more complex structures as the bit-line placement in DRAM (GBL), storage node placement (SN), and 3DNAND. Therefore, it is expected that the main reason for the large diversity in wafer maps is caused by asymmetries in the structure other than the overlay(s) of interest, as such asymmetry is known to exist in these structures.

Two major contributors to asymmetry in the pupil are overlay (e.g., the overlay of interest or parameter of interest) and tilt (or feature asymmetry), where tilt is any geometric tilt or asymmetry in a feature such a as difference between side-wall angle (SWA) of two opposing sides of a feature. These tilt signals are typically considered nuisance signals which impact the desired overlay value, thereby adversely affecting overlay accuracy. As such, it is desirable to decouple the effect of tilt/feature asymmetry from an overlay measurement. Furthermore, it may also be desirable to measure the tilt itself (e.g., as a tilt metric) for one or more features. This tilt metric may be used to monitor the lithographic and/or etch processes which form the feature.

A purpose of the measurement recipe is to accurately map a measured pupil from an (e.g., in-die) target (whether actual product structure or a purposely formed metrology target) to a value for a parameter of interest (e.g., overlay). To do this, In Device Metrology may use self-reference training targets to train overlay recipes using a data-driven or machine learning algorithm. This self-reference training target concept comprises providing a cluster of training targets over which the parameter of interest (e.g., overlay) is varied. As such, each target has a different combination of overlay perturbations, which can be used to train metrology signals (i.e., the measured pupil) towards the designed overlay perturbation/response.

The reference targets typically comprise a target array comprising multiple targets with different biases or induced set values (which may include a zero biased target). The biases may average (or sum to) zero over the array such that a measurement averaged over the array should represent the on-product overlay. Pupils acquired on each reference target are labelled with the overlay bias (across the exposed layers) for training purposes. These training label biases/overlay values are known with good accuracy, since reticle writing error is small. The model then learns to associate a specific reference target pupil response with its respective reference target overlay bias value or label.

The training may be repeated for different acquisition settings (e.g., wavelengths/polarizations etc. of the measurement radiation) and/or other settings varied and/or for different training wafers, e.g., to allow for processing variations between nominally identical targets. The output of such training may comprise multiple, e.g., in the order of hundreds (for example between 100 and 500), candidate measurement recipes, wherein a measurement recipe may be a combination of a trained ML model and an acquisition setting. For example, the acquisition setting may be a free parameter during training such that each acquisition setting has a corresponding model, and such that a measurement recipe comprises the combination of acquisition setting and model. There will be different weight matrices within the model for each recipe.

In the present implementation of such in-die metrology, in-die targets (e.g., as measured in a high volume setting for the actual production monitoring) may be formed e.g., without any intentional overlay bias. A matching step is then performed to determine a matching metric or matching indicator (matching KPI) which quantifies how well-matched the in-die target response is to the self reference training target response. This matching is typically performed by inferring an overlay value from the reference targets using a candidate metrology recipe and comparing this to an inferred overlay value from an in-die target using the same candidate metrology recipe. The closer the inferred values are, the better matched the measurement recipe is (e.g., the matching KPI may be based on the difference between the values). These recipes may be ranked according to various performance indicators or KPIs (e.g., which may include inter alia the matching KPI, an accuracy of overlay prediction KPI, a reproducibility KPI and a repeatability KPI which addresses the error when tracking on-product overlay variation through time). At least one of these recipes may then be chosen for production/HVM monitoring based on the one or more KPIs.

Once trained, the ML model may be used in a production monitoring environment (e.g., a high volume manufacturing HVM environment) to translate measurement pupils (angularly resolved measurement spectra) from the in-die targets exposed on a wafer to an overlay value.

The limitation of this approach is that, while the training can train for variation of overlay signals, the metrology signals will also have an average signal across all the self-reference targets which is orthogonal to the observed signal. Without additional information, orthogonalization of the overlay response with respect to nuisance signals such as tilt is very difficult. Orthogonalization in this respect refers to isolation of an effect, e.g., isolating the overlay signal from the effect of tilt from one or more features.

In addition to the tilt asymmetry signals, other nuisance signals which adversely affect the overlay measurement include other overlays (e.g., of other layers) and stack asymmetries, process change effects (e.g., symmetric stack variations (CD, Height, etc.) and sensor systematics) and noise (e.g., photon shot noise, thermal noise).

Figure 6:
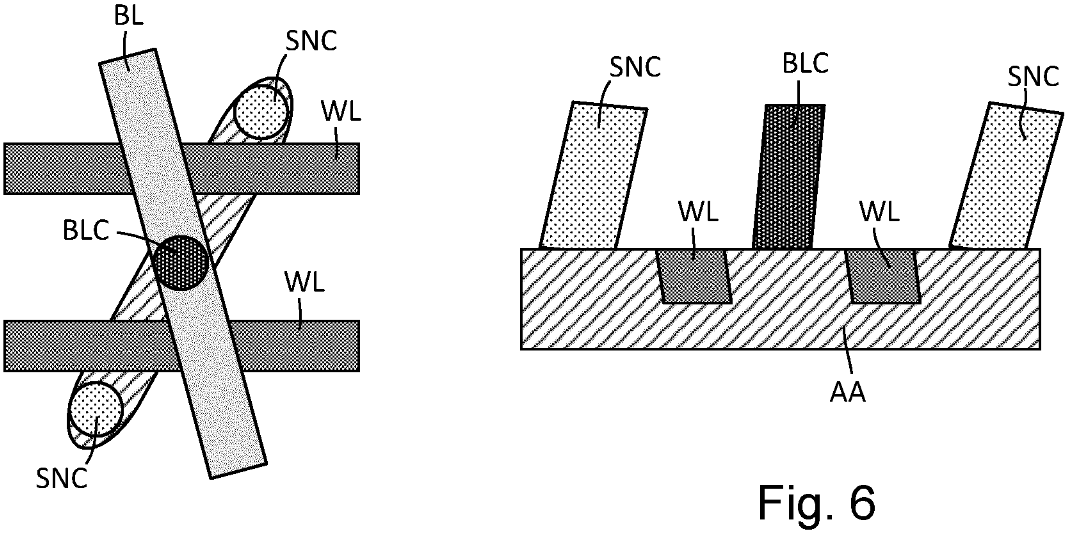
FIG. 6 is a schematic drawing of part of a DRAM cell structure from above and in cross-section.

FIG. 6 illustrates the issue of the effect of feature tilt on overlay. FIG. 6(*a*) shows a typical DRAM device structure from above, and FIG. 6(*b*) shows the same structure in cross-section. The DRAM device structure comprises multiple features, such as bitline BL, bitline contact BLC, wordline WL, storage node contacts SNC and the active area AA. The actual structure and features present are not particularly relevant. What is relevant is that each of these features is a source of a feature asymmetry or tilt contribution in the measured pupil which is combined with the overlay of interest. Separating these feature asymmetries from the desired overlay is a problem which cannot be learned using the existing training methods and self-reference training targets.

To address this issue it is proposed to extend the present self-reference training target concept by providing one or more additional tilt targets or isolated feature targets which do not have all parameters/features of interest included in the device stack, but instead only comprise repetitions of features being patterned in isolation, e.g., to form a grating from the isolated features. For example, where the device being patterned is a DRAM device, a tilt target may comprise only wordline features, only storage node contact features or only bitline contact features. It should be understood that the term "isolated feature target" does not necessarily imply that the target comprises only repetitions of a single feature, although this may indeed be the case. An isolated feature target may also comprise repetitions of two or more features of a product structure, isolated from the other features of that product structure, although this would mean that only the combined asymmetry contribution of these two or more features may be quantified.

Each of these isolated feature targets or tilt targets may be formed in only a single layer; in this way, each tilt target will have no asymmetry due to overlay. Therefore, the majority of asymmetry in a tilt target will be due to the tilt of the feature (or features) of which the target is composed. Because repetitions of each single feature may be isolated in their own tilt target, the amount of tilt or feature asymmetry attributable to a particular feature may be determined from measurement of the tilt target. This may be used as a tilt metric (or feature asymmetry metric) for each feature.

Additionally, because each tilt target comprises a much simpler, single layer stack, other nuisance signal contributions may be minimal.

The isolated feature target(s) or tilt targets should be clustered with the parameter of interest targets or overlay targets at a single location; e.g., the tilt targets and parameter of interest targets should be sufficiently close on the wafer such that it may be assumed that both tilt targets and parameter of interest targets are subject to the same tilt.

In a recent proposed innovation, the details of which are not relevant to this disclosure, the number of self-reference training targets in a target cluster and used for recipe training has been reduced from their present number of 80 to 64. To take advantage of this, in a specific implementation, it is proposed that the tilt targets number 16 and the combination of 16 tilt targets and 64 self-reference training targets are arranged as they are presently in the self-reference training target cluster. In this way, the amount of reticle/substrate real-estate taken up by the reference cluster will remain the same as present. Of course, such an implementation is purely exemplary and the number and/or specific arrangement of either type of target may differ from these examples.

In an embodiment, there may be provided at least one, and typically only one, self-reference training target cluster as disclosed herein on a reticle. For example, a reticle may comprise one such cluster in a scribe lane. In this way, a reference training target cluster may be exposed on a substrate for every field. In this way, the training may be able to train the model to map measurement signals to a parameter of interest value on a per-position (e.g., per wafer position) basis. The training may be performed using a specific training reticle (e.g., comprising the reference targets) via training exposures on training wafers. However, it may be preferred to use the same reticle for training and HVM monitoring. This is because the reference targets may be used for runtime recipe monitoring, to check that the recipe performance does not deteriorate (e.g., due to process variation).

Each cluster may comprise one tilt target per isolated feature, or more than one target may be provided per isolated feature (or for one or more of the features). Providing more than one tilt target per cluster provides redundancy and enables a better estimation or appreciation of noise.

The accompanying overlay targets in the cluster may comprise overlay targets as already described and used in present reference training target cluster; e.g., a pair of gratings, one each in the layers of interest, each target having a different imposed bias (deliberate overlay value).

Figure 7:
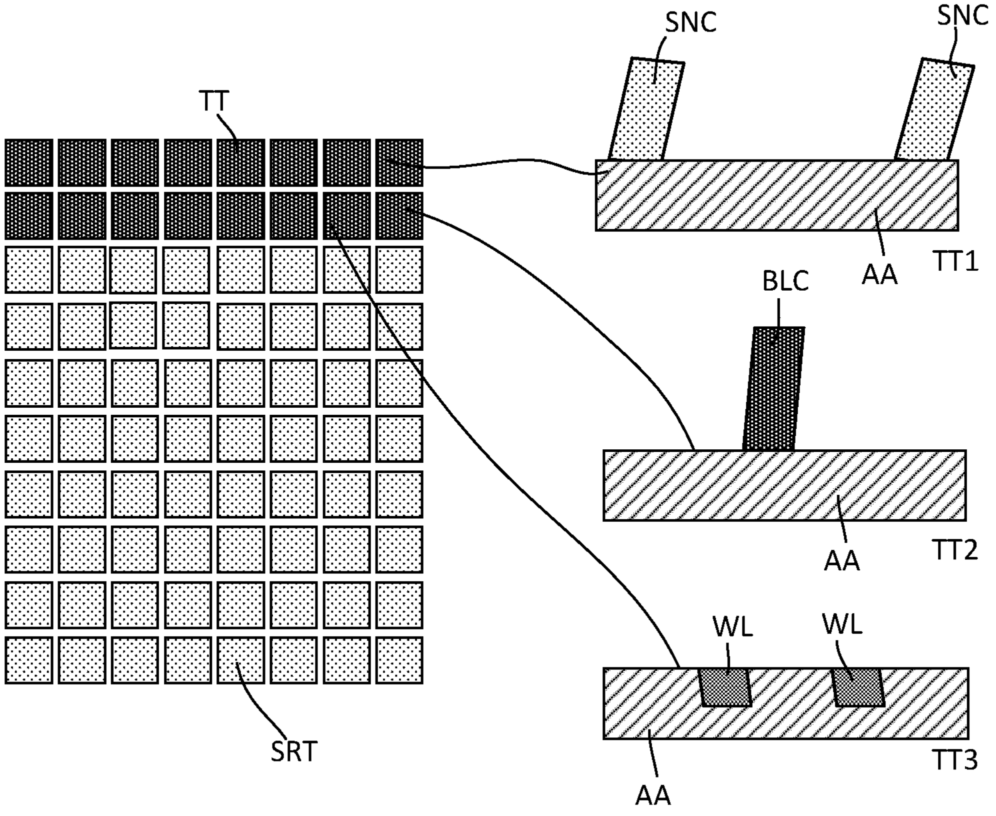
FIG. 7 is a schematic drawing of a self-reference training target cluster according to an embodiment of the invention.

FIG. 7 is an illustrative example of a self-reference target cluster comprising tilt targets, which may be suitable for recipe training for the structure illustrated in FIG. 6. The cluster in this specific example arrangement comprises a 10×8 array of targets where 64 of the targets are conventional self-reference training targets SRT (e.g., overlay targets as described) and 16 are tilt targets or isolated feature targets. A schematic cross-sectional detail of three of the tilt targets are shown: a first tilt target TT1 comprising only storage node contact features SNC on active area AA, a second tilt target TT2 comprising only bitline contact features BLC on active area AA and a third tilt target TT3 comprising only wordline features WL on active area AA. Of course, these are purely examples (specifically relevant for a DRAM structure such as illustrated in FIG. 6). The isolated feature(s) of each tilt target may comprise any isolated feature(s) comprised with the product structure being exposed and therefore for which the metrology recipe will be trained for.

Recipe training using such a cluster may be performed in much the same manner as before and has already been described. As such, the description of the prior training method is equally applicable to the proposed method. However, the machine learning model will now have measurements signals (pupils) from the tilt targets as an input. As such, the ML model can be trained to differentiate the effect of feature asymmetry from the overlay of interest when ranking recipes.

As such, disclosed herein is a method for determining a measurement recipe describing measurement settings for measuring a parameter of interest from a compound structure on a substrate; the method comprising: obtaining first training data relating to measurements of a plurality of reference targets, the plurality of reference targets comprising: a plurality of parameter of interest targets, each parameter of interest target having an induced set value (which optionally may be zero for at least one parameter of interest target) which is varied over said plurality of parameter of interest targets; and one or more isolated feature targets, each comprising repetitions of one or more features comprised within said compound structure in isolation from other features of said compound structure; obtaining second training data comprising a plurality of compound structure measurement signals obtained from measurement of one or more instances of said compound structure, each of said compound structure measurement signals comprising a feature asymmetry contribution due to asymmetry of said one or more features; and training one or more machine learning models using said first training data and second training data to infer a value for the parameter of interest from a measurement signal related to said compound structure corrected for said feature asymmetry contribution.

The recipe training may also train the machine learning model to infer tilt metric values or feature asymmetry metric values (i.e., quantify the tilt) from the (e.g., in-die) targets. As such, the trained model may be able to determine tilt metric values from the in-die targets in a HVM environment, in addition to overlay values. Different reference target clusters will be subject to different values of tilt per feature (fixed over the cluster). The tilt recipe may be trained using the this variation over the wafer and the fact that tilt targets in each cluster have no other sources of asymmetry present Further embodiments of the method, metrology device and lithographic apparatus are disclosed in the subsequent list of numbered clauses:

1. A method for determining a measurement recipe describing measurement settings for measuring a parameter of interest from a compound structure on a substrate; the method comprising: obtaining first training data relating to measurements of a plurality of reference targets, the plurality of reference targets comprising:
   - a plurality of parameter of interest targets, each parameter of interest target having an induced set value which is varied over said plurality of parameter of interest targets; and
   - one or more isolated feature targets, each comprising repetitions of one or more features comprised within said compound structure in isolation from other features of said compound structure;
   - obtaining second training data comprising a plurality of compound structure measurement signals obtained from measurement of one or more instances of said compound structure, each of said compound structure measurement signals comprising a feature asymmetry contribution due to asymmetry of said one or more features; and training one or more machine learning models using said first training data and second training data to infer a value for the parameter of interest from a measurement signal related to said compound structure corrected for said feature asymmetry contribution.

2. A method as defined in clause 1, wherein said compound structure comprises product compound structure or a representative proxy therefor.

3. A method as defined in clause 1 or 2, wherein said parameter of interest is overlay and said induced set values are overlay biases.

4. A method as defined in any preceding clause, wherein said one or more isolated feature targets comprises a plurality of isolated feature targets.

5. A method as defined in clause 4, wherein the plurality of isolated feature targets number more than 5.

6. A method as defined in clause 4, wherein the plurality of isolated feature targets number more than 10.

7. A method as defined in clause 4, wherein the plurality of isolated feature targets number more than 15.

8. A method as defined in any preceding clause, wherein the plurality of parameter of interest targets number more than 50.

9. A method as defined in any preceding clause, wherein one or more of said one or more isolated feature targets each comprise repetitions of only one feature comprised within said compound structure.

10. A method as defined in any preceding clause, wherein one or more of said one or more isolated feature targets are formed in a single layer.

11. A method as defined in clause 10, wherein said single layer is a bottom or lower layer of said compound structure.

12. A method as defined in any preceding clause, wherein said training step comprises training said one or more machine learning models to determine a value for a feature asymmetry metric quantifying said feature asymmetry contribution for said one or more features comprised in at least one of said one or more isolated feature targets.

13. A method as defined in any preceding clause, wherein said first training data further relates to measurement of said reference targets using a plurality of different acquisition settings for acquiring said first training data, and said training step comprises training a plurality of said machine learning models to obtain a plurality of candidate measurement recipes, such that each candidate measurement recipe comprises a candidate combination of a trained machine learned model and a corresponding acquisition setting; and the method comprises:

determining a preferred measurement recipe from said candidate measurement recipes using said second training data.

14. A method as defined in clause 13, comprising:

determining a matching metric for each candidate measurement recipe from a comparison of recipe performance in inferring said parameter of interest from said compound structure; and using the matching metric in selecting the preferred measurement recipe from said candidate measurement recipes.

15. A method as defined in clause 14, comprising ranking said candidate measurement recipes according to one or more performance indicators, where said one or more performance indicators comprises said matching metric.

16. A method as defined in clause 13, 14 or 15, wherein said first training data comprises first labeled training data for training said one or more machine learning models, the first labeled training data comprising measurements from each reference target labeled by its respective induced set value.

17. A method as defined in any of clauses 13 to 16, comprising using the preferred measurement recipe for performing a measurement of said compound structure on a product substrate and inferring a value for the parameter of interest from said measurement.

18. A method as defined in clause 17, comprising using the preferred measurement recipe to infer a value for at least one feature asymmetry metric from said measurement.

19. A method as defined in any preceding clause, wherein said plurality of reference targets are clustered in a target cluster.

20. A method as defined in clause 19, wherein said cluster comprises an array of 10 reference targets by 8 reference targets.

21. A computer program comprising program instructions operable to perform the method of any of clauses 1 to 20, when run on a suitable apparatus.

22. A non-transient computer program carrier comprising the computer program of clause 21.

23. A processing system comprising a processor and a storage device comprising the computer program of clause 22.

24. A metrology device comprising the processing system of clause 23.

25. A metrology device as defined in clause 24, being operable to measure said plurality of reference targets to obtain said first training data and said one or more instances of said compound structure to obtain said second training data.

26. A substrate comprising:

at least one compound structure; and at least one target cluster, each said target cluster comprising a plurality of reference targets, the plurality of reference targets comprising:

a plurality of parameter of interest targets, each parameter of interest target having an induced set value which is varied over said plurality of parameter of interest targets; and one or more isolated feature targets, each comprising repetitions of one or more features comprised within a compound structure in isolation from other features of said structure.

27. A substrate as defined in clause 26, wherein said at least one compound structure comprises a plurality of similar compound structures.

28. A substrate as defined in clause 26 or 27, wherein said compound structure comprises product compound structure or a representative proxy therefor.

29. A substrate as defined in any of clauses 26 to 28, wherein said parameter of interest is overlay and said induced set values are overlay biases.

30. A substrate as defined in any of clauses 26 to 29, wherein said one or more isolated feature targets comprises a plurality of isolated feature targets.

31. A substrate as defined in clause 30, wherein the plurality of isolated feature targets number more than 5.

32. A substrate as defined in clause 30, wherein the plurality of isolated feature targets number more than 10.

33. A substrate as defined in clause 30, wherein the plurality of isolated feature targets number more than 15.

34. A substrate as defined in any of clauses 26 to 33, wherein the plurality of parameter of interest targets number more than 50.

35. A substrate as defined in any of clauses 26 to 34, wherein one or more of said one or more isolated feature targets each comprise repetitions of only one feature comprised within said compound structure.

36. A substrate as defined in any of clauses 26 to 35, wherein one or more of said one or more isolated feature targets are formed in a single layer.

37. A substrate as defined in clause 36, wherein said single layer is a bottom or lower layer of said compound structure.

38. A substrate as defined in any of clauses 26 to 37, wherein each said target cluster comprises an array of 10 reference targets by 8 reference targets.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method for determining a measurement recipe describing one or more measurement settings for measuring a parameter of interest from a compound structure on a substrate, the method comprising:

obtaining first training data relating to measurements of a plurality of reference targets, the plurality of reference targets comprising:

a plurality of parameter of interest targets, each parameter of interest target having an induced set value which is varied over the plurality of parameter of interest targets; and one or more isolated feature targets, each isolated feature target comprising repetitions of one or more features comprised within the compound structure in isolation from other features of the compound structure;

obtaining second training data comprising a plurality of compound structure measurement signals obtained from measurement of one or more instances of the compound structure, each of the compound structure measurement signals comprising a feature asymmetry contribution due to asymmetry of the one or more features; and training, performed by a computer system, of one or more machine learning models using the first training data and second training data to infer a value for the parameter of interest from a measurement signal related to the compound structure corrected for the feature asymmetry contribution.

2. The method as claimed in claim 1, wherein the compound structure comprises a product compound structure or a representative proxy therefor.

3. The method as claimed in claim 1, wherein the parameter of interest is overlay and the induced set values are overlay biases.

4. The method as claimed in claim 1, wherein one or more of the one or more isolated feature targets each comprise repetitions of only one feature comprised within the compound structure.

5. The method as claimed in claim 1, wherein one or more of the one or more isolated feature targets are formed in a single layer.

6. The method as claimed in claim 1, wherein the training comprises training the one or more machine learning models to determine a value for a feature asymmetry metric quantifying the feature asymmetry contribution for the one or more features comprised in at least one of the one or more isolated feature targets.

7. The method as claimed in claim 1, wherein the first training data further relates to measurement of the reference targets using a plurality of different acquisition settings for acquiring the first training data;

wherein the training comprises training a plurality of the machine learning models to obtain a plurality of candidate measurement recipes, such that each candidate measurement recipe comprises a candidate combination of a trained machine learning model and a corresponding acquisition setting; and further comprising determining a preferred measurement recipe from the candidate measurement recipes using the second training data.

8. The method as claimed in claim 7, further comprising:

determining a matching metric for each candidate measurement recipe from a comparison of recipe performance in inferring the parameter of interest from the compound structure; and using the matching metric in selecting the preferred measurement recipe from the candidate measurement recipes.

9. The method as claimed in claim 7, wherein the first training data comprises first labeled training data for training the one or more machine learning models, the first labeled training data comprising measurements from each reference target labeled by its respective induced set value.

10. The method as claimed in claim 7, comprising using the preferred measurement recipe for performing a measurement of the compound structure on a product substrate and inferring a value for the parameter of interest from the measurement.

11. The method as claimed in claim 10, further comprising using the preferred measurement recipe to infer a value for at least one feature asymmetry metric from the measurement.

12. The method as claimed in claim 1, wherein the plurality of reference targets are clustered in a target cluster.

13. A metrology device comprising:

a storage device comprising program instructions configured to perform the method of claim 1, when run on a suitable apparatus.

14. The metrology device as claimed in claim 13, configured to measure the plurality of reference targets to obtain the first training data and measure the one or more instances of the compound structure to obtain the second training data.

15. A non-transitory computer-readable medium comprising instructions therein, the instructions, when executed by a computer system, configured to cause the computer system to at least:

obtain first training data relating to measurements of a plurality of reference targets, the plurality of reference targets comprising:

a plurality of parameter of interest targets, each parameter of interest target having an induced set value which is varied over the plurality of parameter of interest targets; and one or more isolated feature targets, each isolated feature target comprising repetitions of one or more features comprised within a compound structure in isolation from other features of the compound structure;

obtain second training data comprising a plurality of compound structure measurement signals obtained from measurement of one or more instances of the compound structure on a substrate, each of the compound structure measurement signals comprising a feature asymmetry contribution due to asymmetry of the one or more features; and train one or more machine learning models using the first training data and second training data to infer a value for a parameter of interest from a measurement signal related to the compound structure corrected for the feature asymmetry contribution.

16. The computer-readable medium of claim 15, wherein the parameter of interest is overlay and the induced set values are overlay biases.

17. The computer-readable medium of claim 15, wherein the instructions are further configured cause the computer system to train the one or more machine learning models to determine a value for a feature asymmetry metric quantifying the feature asymmetry contribution for the one or more features comprised in at least one of the one or more isolated feature targets.

18. The computer-readable medium of claim 15, wherein the first training data further relates to measurement of the reference targets using a plurality of different acquisition settings for acquiring the first training data and wherein the instructions are further configured to cause the computer system to:

train a plurality of the machine learning models to obtain a plurality of candidate measurement recipes, such that each candidate measurement recipe comprises a candidate combination of a trained machine learning model and a corresponding acquisition setting; and determine a preferred measurement recipe from the candidate measurement recipes using the second training data.

19. The computer-readable medium of claim 18, wherein the instructions are further configured to cause the computer system to cause use of the preferred measurement recipe for performance of a measurement of the compound structure on a product substrate and infer a value for the parameter of interest from the measurement.

* * * * *